United States Patent [19]

Collins

[11] Patent Number: 4,958,560
[45] Date of Patent: Sep. 25, 1990

[54] PRINTING SCREEN AND METHOD OF PRINTING A NON-ABSORBENT SUBSTRATE

[75] Inventor: Terence W. Collins, St. Helens, England

[73] Assignee: Pilkington plc, Merseyside, England

[21] Appl. No.: 162,683

[22] Filed: Mar. 1, 1988

[30] Foreign Application Priority Data

Mar. 4, 1987 [GB] United Kingdom ................. 8705075

[51] Int. Cl.⁵ .......................... B41F 15/36; B05D 1/32
[52] U.S. Cl. ................. 101/128.21; 101/129; 427/282
[58] Field of Search ................. 101/127, 128.21, 128.4, 101/129; 427/282

[56] References Cited

U.S. PATENT DOCUMENTS

| | | | |
|---|---|---|---|
| 3,023,697 | 3/1962 | Benavides et al. | 101/129 |
| 3,759,800 | 9/1973 | Reinke | 101/128.4 X |
| 3,813,519 | 5/1974 | Jochim et al. | |
| 3,852,564 | 12/1974 | Baum et al. | 101/127 X |
| 3,900,634 | 8/1975 | Plumat et al. | 428/208 |
| 4,084,506 | 4/1978 | Nakatani | 101/127 |
| 4,301,189 | 11/1981 | Arai et al. | |
| 4,324,815 | 4/1982 | Mitani et al. | 427/282 X |
| 4,379,737 | 4/1983 | Mearig | |
| 4,791,006 | 12/1988 | Galvagni et al. | 101/127 X |

FOREIGN PATENT DOCUMENTS

| | | | |
|---|---|---|---|
| 193464 | 9/1986 | European Pat. Off. | 101/127 |
| 3231382 | 3/1984 | Fed. Rep. of Germany | 101/129 |
| 124698 | 9/1980 | Japan | 101/127 |
| 19039 | 4/1982 | Japan | 101/128.4 |
| 160198 | 9/1983 | Japan | 101/127 |
| 121095 | 6/1987 | Japan | 101/127 |
| 1262176 | 2/1972 | United Kingdom | 101/129 |
| 2091529 | 7/1982 | United Kingdom | |

OTHER PUBLICATIONS

Brady et al., "Screening Mask for Depositing Large Area Paste Deposits", IBM Tech. Disc. Bul., vol. 20, No. 9, pp. 3429-3430; Feb. 1978.

*Primary Examiner*—Clifford D. Crowder
*Attorney, Agent, or Firm*—Burns, Doane, Swecker & Mathis

[57] ABSTRACT

A method of screen printing a hard non-absorbent substrate, such as glass, using a screen with a patterned coating on its surface facing the substrate comprises providing local support between the screen surface and the substrate in one or more areas in which a patterned ink layer of increased thickness is required, thereby enhancing ink retention in those areas. The method is especially useful for printing patterns of varying thickness in selected locations, for example, for printing heater arrays in conductive ink on vehicle windows. The invention also includes novel screens for use in the method.

18 Claims, 4 Drawing Sheets

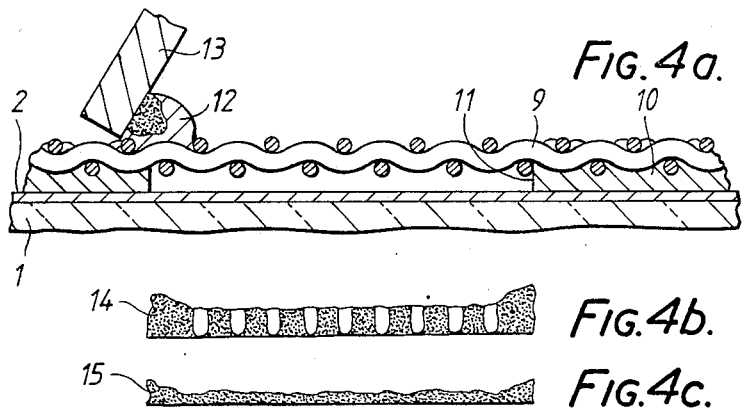
FIG.4a.
FIG.4b.
FIG.4c.
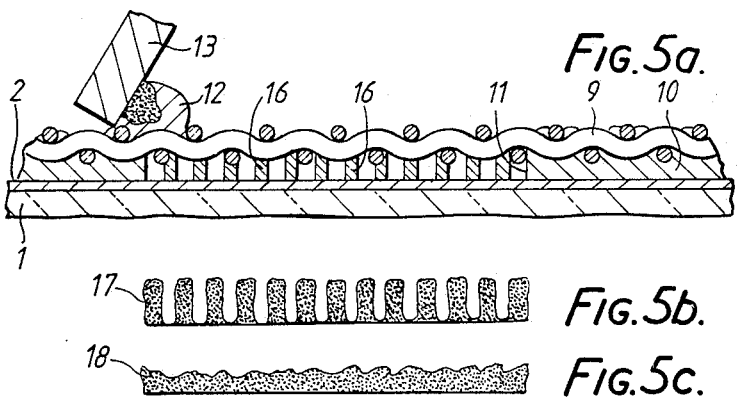
FIG.5a.
FIG.5b.
FIG.5c.
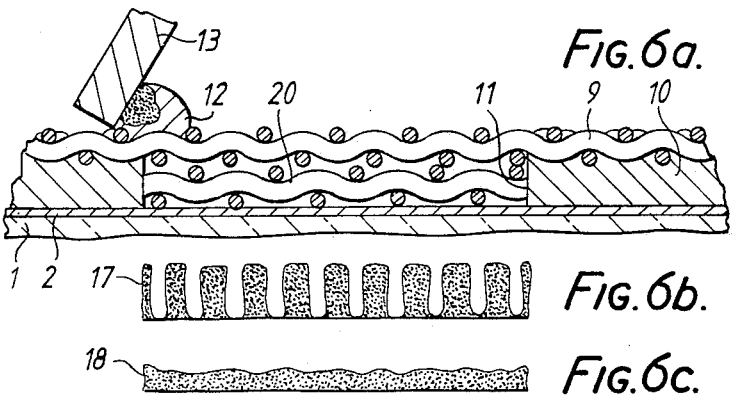
FIG.6a.
FIG.6b.
FIG.6c.

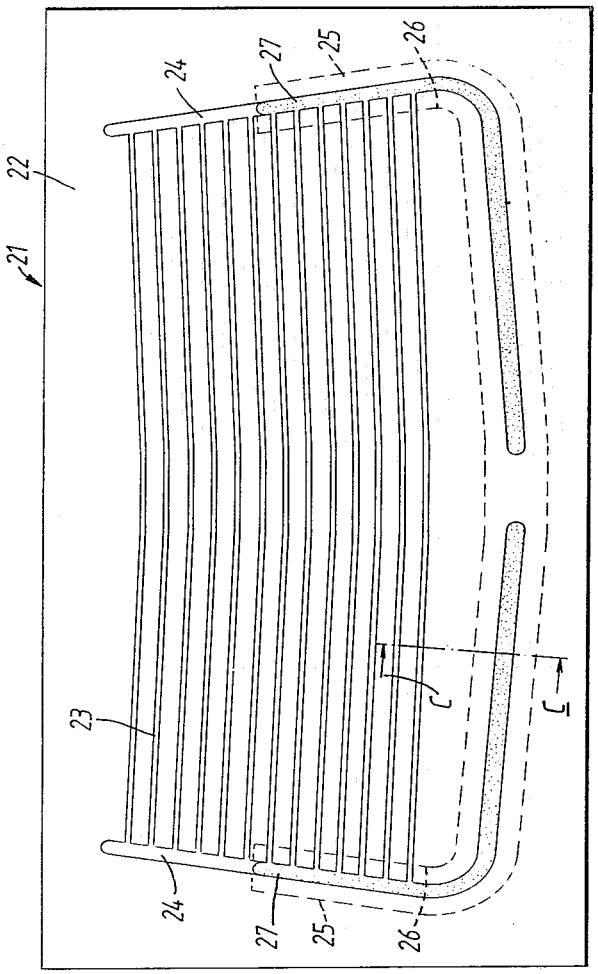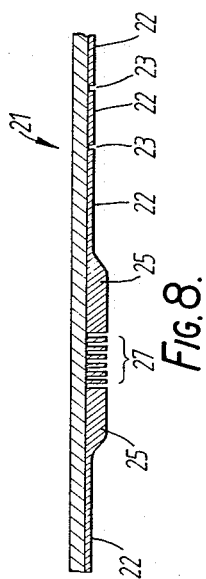

PRINTING SCREEN AND METHOD OF PRINTING A NON-ABSORBENT SUBSTRATE

BACKGROUND OF THE INVENTION

1. Field of the Invention

The invention relates to printing, and in particular to a method of screen printing on hard non-absorbent materials such as glass, and screens for use in such a method.

An important application of screen printing is in the printing of heater arrays comprising electrically conducting networks on rear windows for motor vehicles, so that the surface of the window can be heated to demist or de-ice the window. Such heater arrays on the glass generally comprise an array of heating conductors extending across the window between bus bars adjacent the lateral edges of the glass.

The heater array may be printed on one surface of a glass pane which is to form the vehicle window, before the pane is heated for bending and toughening, using an ink which is a mixture of glass frit, silver and binder material. The heater pattern is screen printed using a screen in which the required pattern is defined by a coating on the screen surface, and is fired on to the glass surface when the glass sheet is heated for bending and toughening; the binder is generally burnt off during the firing process. The ink may include a resin which is curable by ultra-violet light so that the printed heater array can be cured by brief exposure to ultra-violet light before handling.

2. Description of the Prior Art

It is desirable to be able to increase the thickness of the printed ink pattern at one or more locations, for example to selectively increase the conductance of parts of the pattern such as the bus bars, or to provide a thicker conductive layer where an electric connector is to be soldered on to a bus bar. It is possible to increase the thickness of the pattern in selected locations by printing a second layer of ink over those pattern areas in which the increased thickness is required using an appropriately patterned screen. However, it is difficult in practice to achieve the necessary registration between the two prints, and, because of the need for a second pass through a printing process, additional production costs are incurred.

British Pat. specification No. GB 1 262 176 relates to the screen printing of electronic circuits using metal screens in place of woven fabric screens. The required pattern is printed through openings in the screen, which thus acts as a stencil for the pattern. In order to print pattern areas of varying thickness, it is proposed to incorporate a metal mesh in the openings where an ink layer of reduced thickness is required. This mesh occupies a part of the volume which would otherwise be available for the paste or ink being printed on the substrate, and leads to a reduction in the thickness of the pattern printed in such areas.

European Pat. specification No. EP 0 193 464 A2 refers to two methods for selectively increasing the thickness of certain areas of a conductive pattern to be used as a heater array on a vehicle window. In the first method, said to be described in DE TM OS 32 31 382, a screen is used which has thicker threads, for example thicker weft threads, in those areas in which a thicker conductive layer is required. In the second method, the subject of EP 0 193 464 A2, a screen is used which has a coarser mesh in those areas in which a thicker conductive layer is required; this coarser mesh is achieved by omitting alternate weft threads from the screen material in those areas.

The two methods referred to in the European patent specification both suffer from the disadvantage that all parts of the patterns in the areas in which the weft (or warp) fibres are modified or omitted are increased in thickness. It is desirable to have a more versatile method in which any desired areas, or all areas of the printed pattern can be increased in thickness.

In British Pat. specification No. GB 1 307 535, this problem is avoided by using a silk screen on which a patterned emulsion coating defining the pattern to be printed is of increased thickness in areas surrounding and defining the areas in which increased ink thickness is required. However, in practice this method has not proved very successful, especially when printing wide bands of ink, such as the bus bars of heater arrays on vehicle backlights.

SUMMARY OF THE INVENTION

It has now been found that the thickness of a patterned ink layer screen printed on a hard non-absorbent substrate can be increased in required locations by providing local support between the screen surface and the substrate in those areas in which increased thickness is required.

Surprisingly, it is found that the use of local support between the screen surface and the substrate leads (provided the support is not too bulky) to increased ink retention in those areas, despite the effect of said support in occupying volume which would otherwise be available for occupation by the ink.

According to the present invention, there is provided a method of screen printing a pattern on a hard non-absorbent substrate using a screen with a patterned coating on its surface facing the substrate which comprises providing local support between the screen surface and the substrate in one or more areas in which a patterned ink layer of increased thickness is required thereby enhancing ink retention in the said area or areas.

The method of the invention is especially useful for printing patterns of varying thickness.

The local support may be provided by one or more patches of screen material adhered to the coated surface of the screen, or by one or more arrays of small spaced spots of coating on the screen, in those areas in which a patterned ink layer of increased thickness is required.

When one or more patches or screen material is used, any such patch is preferably of coarser mesh than the screen.

When an array of small spaced spots of coating on the screen is used, it is convenient to use a uniform array. The shape of the spots is not critical, but round spots are preferred. The small spaced spots of coating may occupy about 10% of the area in which the ink layer of increased thickness is required, and preferably occupy 1% to 15%, especially 2.5% to 10%, of said area. The patterned coating in any area of the screen will usually be at least as thick as the coating of ink required in that area. In the screen areas surrounding and defining the area(s) in which an ink layer of increased thickness is required i.e. the areas surrounding and defining the area(s) of arrays of small spaced spots, the coating on the screen will usually have a thickness of over 30 microns, and preferably a thickness in the range 30 to 70 microns. It is not necessary for the coating to be as thick in other areas, and such areas will usually have a coating thickness in the range 5 to 15 microns, preferably 7 to 12 microns.

The small spaced spots of coating may be formed of the same material as the patterned coating and be of a height equal to the thickness of said coating, which will usually be at least 30 microns in the area(s) immediately surrounding the area(s) in which a patterned ink layer of increased thickness is required. The spots may be printed as described hereafter by including appropriate half tone areas in the artwork used in producing the screen.

The method of the present invention is especially useful for printing a pattern in the form of a heating array on a glass pane for use as a vehicle window. In one embodiment, the pattern comprises an array of heating conductors extending between bus bars, and local support is provided in those areas of the bus bars where the connectors for conductors supplying the heating current are to be attached.

According to a further aspect of the invention, there is provided a printing screen with a patterned coating on at least one surface thereof having a patch of screen material adhered to the screen in each of one or more areas in which a patterned ink layer of increased thickness is to be printed.

According to a still further aspect of the invention, there is provided a printing screen with a patterned coating on at least one surface thereof including an array of small spaced spots of coating on the screen surface in each of one or more areas in which a patterned ink layer of increased thickness is required, the thickness of the coating in the areas surrounding and defining the area(s) in which an ink layer of increased thickness is required being greater than the thickness of the coating in other areas. Preferably the thickness of the coating in the areas surrounding and defining the area(s) in which an ink layer of increased thickness is required is at least 30 microns. The coating in other areas preferably has a thickness in the range 5 to 15 microns.

BRIEF DESCRIPTION OF THE DRAWINGS

The application of the invention to the printing of a heating array on a vehicle window in which the bus bars are of increased thickness in those areas in which connectors are to be attached will now be described by way of example, and with reference to the accompanying drawings, in which:

FIG. 7 is a diagrammatic plan view of a printing screen in accordance with the invention for printing a heater array with extended bus bars, FIG. 8 is a section on the line C—C in FIG. 7.

Figure 1:
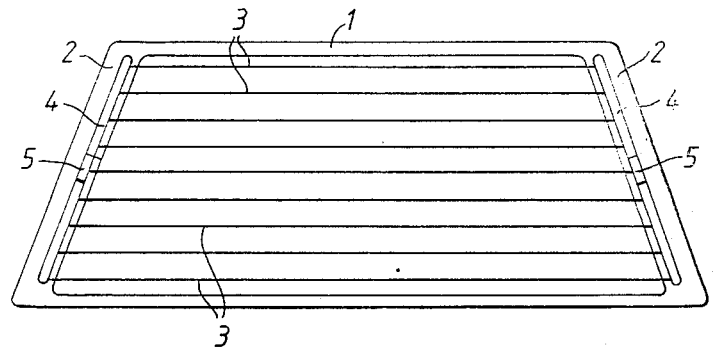
FIG. 1 is a view of the inside surface of a vehicle rear window with an obscuration band around its periphery and a heater array.

In the drawings the dimensions of some parts are greatly exaggerated for the sake of clarity.

DETAILED DESCRIPTION OF PREFERRED EMBODIMENTS

FIG. 1 illustrates a vehicle window comprising a glass pane 1 which has a black obscuration band 2 printed around the periphery of the inner surface of the pane using a black paint which is then cured in known manner. Printed onto the inner surface of the glass pane, and on top of the obscuration band, is a heater array comprising electrical resistance heating conductors 3 which extend between bus bars 4. The heater array is screen printed on to the glass surface which already carries the obscuration band using a ceramic ink. The ink is a mixture of glass frit, silver and a binder material and may include a proportion of ultra-violet curable resin. The layout of the heater array is designed so that the bus bars 4 are screen printed on top of the obscuration band 2 as shown more clearly in FIG. 2.

Figure 2:
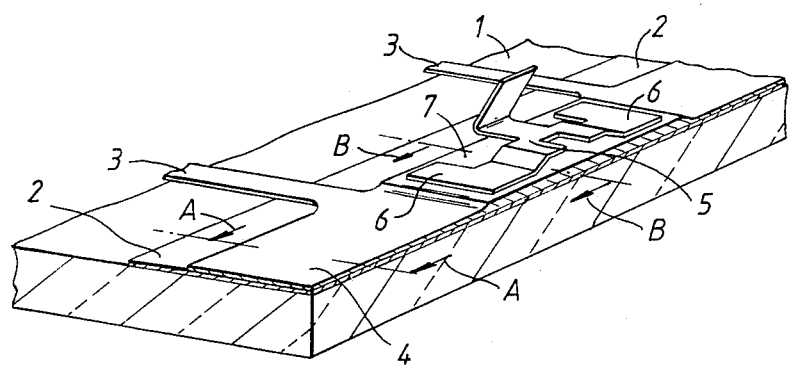
FIG. 2 is an enlarged perspective view, partly in section, showing the region of one of the bus bars of the heater array with a connector attached.

A T-shaped copper connector 5 is soldered to each of the bus bars and in the particular embodiment illustrated in FIG. 2 each connector 5 has two feet 6 which are connected by a bridge from which the connection tab extends.

The heater array 3, 4 is screen printed onto the glass surface using ceramic ink and is then fired onto the glass surface when the glass sheet is heated, for example on to a temperature in the range 580° C. to 670° C., before being bent to shape and then toughened using streams of cooling air.

Figure 3A:
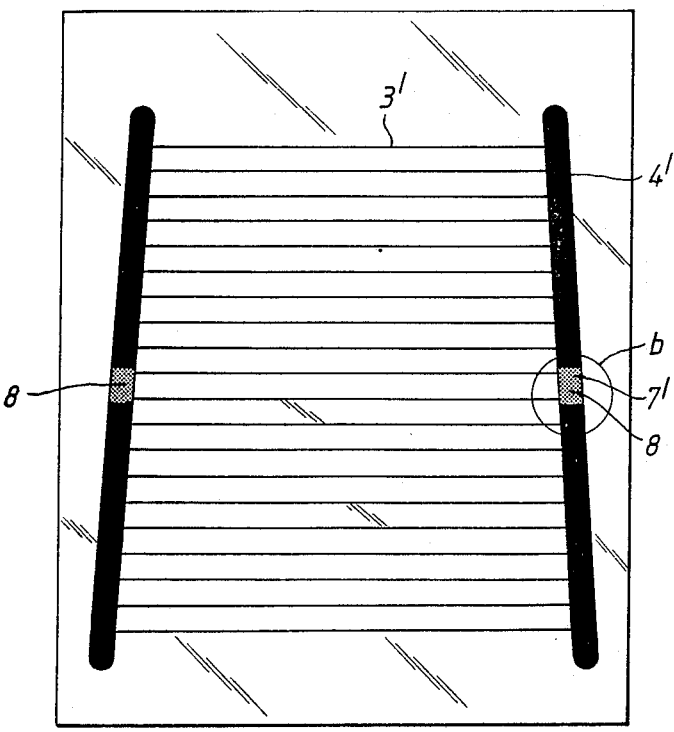
FIG. 3a is a diagrammatic view of the artwork used for producing a printing screen for printing the heater array onto the glass surface.
Figure 3B:
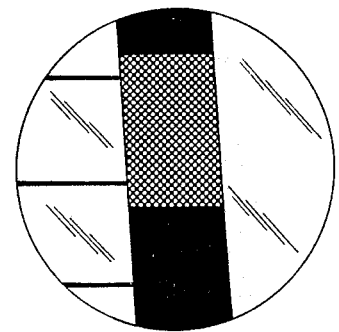
FIG. 3b is an enlarged view of the detail shown at b in FIG. 3a, FIGS. 4a to 4c illustrate the screen printing of a bus bar at the section A—A of FIG. 2, FIGS. 5a to 5c illustrate the printing of a thicker part of the bus bar at the section B—B of FIG. 2, and FIGS. 6a to 6c illustrate an alternative way of printing a thicker area of the bus bar at the section B—B of FIG. 2.

FIGS. 3a and 3b illustrate diagrammatically the artwork used for the production of a printing screen for carrying out the method of the invention. The heater array of heating conductors 3' and bus bars 4' are drawn in solid black on a transparent film, and in the local areas 7' where connectors are to be soldered to the bus bars, areas of half tone transparency 8, shown more clearly in FIG. 3b, are incorporated into the artwork. Typically the half tone transparencies 8 employed are such that 90% of the area of each transparency 8 is solid black defining a uniform array of spaced clear spots.

The printing screen may be prepared by coating a suitable screen and forming a pattern in the coating. Usually a woven screen which has 100 or 120 threads per centimeter is cleaned and sufficient layers of wet photosensitive emulsion applied and dried to provide an emulsion layer approximately 10 microns thick over one surface of the screen. One or more layers of emulsion may also be applied and dried on the other surface of the screen as is known in the art. Further coatings of emulsion are successively applied and dried to said one surface of the screen in the areas surrounding and defining the areas in which an ink layer of increased thickness is required to provide a layer of dried emulsion coating which may, for example, be approximately 40 to 60 microns thick in such areas.

The artwork of FIG. 3a is then placed against the coating of dried emulsion and secured in position with transparent tape. The transparency and screen combination is placed on a glass plate with the transparency between the screen and the plate. The screen is then covered and vacuum applied to remove air and ensure good flat contact between the glass, the transparency and the screen. A light source is then switched on behind the glass plate for the required exposure time. The screen is separated from the artwork and the glass plate and washed with warm water sprays to dissolve away the non-exposed areas of the emulsion, that is, to dissolve away the heater array pattern including 90% of the half tone areas 7', leaving a patterned coating 10 (see FIGS. 4a and 5a) of photocured emulsion on the screen.

The printing screen is then placed on the glass pane 1 with the emulsion coated side in contact with the glass pane 1 and the obscuration band 2. This is illustrated in FIG. 4a which shows a section through the woven screen 9 carrying coating 10 in which there is an aperture 11 corresponding to the width of a bus bar in the region of a thinner part of the bus bar, for example at the section A—A in FIG. 2. Section A—A is close to an area in which an ink layer of increased thickness is required, and the thickness of the coating 10 on the screen A—A is approximately 40 microns. Wet ceramic ink 12 is then spread on to the screen 9 during the first passage of a squeegee blade 13 across the screen. This first passage of the squeegee 13 forces ink 12 through the screen where there is any aperture in the coating 10 such as the bus bar aperture 11. On the return run of the squeegee back across the screen the retained ink is forced into the aperture 11 and on to the surface of the obscuration band 2 on the glass.

Where the thinner parts of the bus bar are being printed the first run of the squeegee blade 13 depresses the unsupported parts of the screen 9 downwardly towards the glass surface. That is, in FIG. 4a, the run of the squeegee across the aperture 11 will depress the screen 9 somewhat into that aperture thereby limiting the whole height for the retention of ink for printing on to the obscuration band. FIGS. 4b and 4c illustrate how the height of ink 14 which passes through the mesh of the screen 9 (shown in FIG. 4b) is depressed so that at the end of the printing process, when the ink has run together to form a printed layer 15 on the glass surface, only a thin layer (shown in FIG. 4c) is produced. For example in the embodiment illustrated the thickness of the printed ink layer at the section A—A of the printed bus bar is 22 microns, while the local thickness of the coating 10 on the screen is 40 microns and the screen itself is 65 microns thick.

In the area of the printing screen which is to print the thicker area 7 of the bus bar, the emulsion coating, as indicated in FIG. 5a, includes a half tone array of solid spots 16 which are distributed regularly over the whole local area which produces the thicker area 7 of the bus bar. These spots 16 constitute 10% of the area and provide, in effect, supports for the screen 9 in the bus bar aperture 11.

The effect of this modification of the printing screen, to incorporate half tone areas in the coating where the connectors are to be soldered to the bus bars, is to enhance the retention of the ceramic ink within those areas during the first pass of the squeegee blade 13 across the screen because the screen is not substantially depressed towards the glass surface, so that after the second passage of the squeegee a deeper quantity 17 (FIG. 5b) of the ceramic ink is retained in the aperture 11 which runs to form a thicker printed area as indicated at 18 (FIG. 5c). The depth of the ink 18 which is thereby printed onto the surface of the obscuration band 2 to form one of the thicker areas 7 of the bus bar may be twice the thickness of the ink 15 printed on the thinner parts of the bus bar, for example about 40 microns thick. Thus, in the embodiment illustrated, the thickness of ink in the area of increased thickness corresponding to the half tone areas is 36 microns, while the local thickness of the coating on the screen is 40 microns and the screen itself is 65 microns thick.

It has been found that a 50% increase in the thickness of each bus bar in the areas where the connectors are to be soldered is sufficient, although a thickness increase of 100% can be achieved using the half tone pattern areas provided the emulsion coating is sufficiently thick in the areas surrounding and defining the half tone areas.

The enhancement of ink retention by the local support provided the spots 16 given at each of the dotted areas an increased presence of silver in the thicker area of ink 18 so that even though there may be absorption of silver from the fired ink into the obscuration band, there remains sufficient silver in each of the thicker areas 7 to ensure a satisfactory soldered joint with the T-shaped connector.

FIG. 6a illustrates an alternative way of enhancing the retention of ceramic ink to produce the thickened areas 7. The artwork for producing the printing screen does not have any special areas of the bus bars 4' as in FIG. 3, the drawing of the bus bars being continuous and solid. A patch 20 of screen material of coarser mesh cut to the size of the thicker areas 7 is adhered to the screen 9 in areas of the screen which define the areas where connectors are to be soldered to the bus bars. The patches 20 may be secured to the screen by means of a suitable adhesive before the emulsion is applied but more suitably are placed in position after the emulsion has been applied and while it is still wet, and additional emulsion used to cover the patches. After exposure and washing of the screen the patches 20 are in position in the emulsion coating 10 as indicated in FIG. 6a. During the passages of the squeegee 13 across the screen each of the patches 20 serves to support the screen 9 and to provide a coarser mesh for enhanced retention of ceramic ink so that a depth of ceramic ink 17 (FIG. 6b) is retained giving a quantity of ink 17 in those areas sufficient to produce, when fired, the thicker areas 7 of the bus bar. The depth of ink 17 collapses to a thickness of 18 as indicated in FIG. 6c which is comparable to the thickness produced by printing through the half tone areas in FIG. 5a.

The method of the invention is also useful for printing heated backlights with extended bus bars which are sometimes employed, not only as a heater, but also as an antenna for a radio. FIGS. 7 and 8 illustrate a silk screen in accordance with the invention for printing a heated backlight of this kind. In these Figures, a silk screen 21 carries a patterned layer of dried emulsion 22 defining the pattern for two opposed L-shaped bus bars 24 and a plurality of parallel heating conductors 23 extending between the bus bars.

When such L shaped bus bars are employed, it is desirable, to avoid excessive power dissipation in the bus bars, to provide thickened bus bars, at least in the sections of the bus bars extending from the adjacent ends thereof (where terminals are attached for the supply of heating current and derivation of a radio signal) to half-way up the array of heating conductors. To achieve this increased thickness, the screen is initially coated uniformly with a number of layers of emulsion which are successively applied and dried, in known manner, over the whole area of the screen. A further series of emulsion layers are then applied and dried, using appropriate masks to contain the emulsion, to the screen area 25, having the shape of an inverted channel section and defined by the broken line 26 in FIG. 7. It is desirable to provide a gradual transition between the thinner and thicker emulsion layers (see FIG. 8) and this may be achieved by, for example, using a series of masks with progressively reduced coating areas to apply the successive layers of emulsion to area 25, and dissolving away, for example with water, any resulting sharp corners. The pattern in the emulsion is then prepared using appropriate art work, using half tone transparencies (as described above with reference to FIGS. 3a and 3b) in the parts of the bus bars within area 25. Again, the half tone transparency employed is typically such that about 90% of the area of each transparency in solid black defines a regular array of spaced clear spots. The spaced clear spots result in the production of a corresponding array, designated 27, of solid spots or columns over the area of the screen which is to be used to print the thicker areas of the L-shaped bus bars.

Using a screen as described above, a heated backlight suitable for use as a radio antenna without unacceptable power dissipation, can be printed in a single printing stage. This compares favourably with the prior art process, which required overprinting of the thickened areas of the bus bars, involving a second pass down the printing line.

The invention thus provides a versatile and precise solution to the problem of printing a pattern of increased thickness in selected local areas, without the need for overprinting with a second layer of ink. Overprinting using the method of the invention enables especially thick patterned layers to be achieved.

I claim:

1. An improved method of screen printing a patterned ink layer on a hard non-absorbent substrate using a screen with a patterned coating on its surface facing the substrate, said method comprising the steps of providing between the screen surface and the substrate local support distributed over at least one area in which a patterned ink layer of increased thickness is required thereby enhancing ink retention in said at least one area, the at least one area comprising only a part of the patterned ink layer printed by said screen, applying ink to said screen and printing the patterned ink layer on said substrate through said screen, whereby the ink layer in said at least one area is thicker than in another area of the ink layer.

2. A method according to claim 1, wherein said location support is provided by adhering one or more patches of screen material to the coated surface of the screen.

3. A method according to claim 2, wherein said adhering step comprises adhering a patch or patches of screen material which are of coarser mesh than the screen.

4. A method according to claim 1, wherein said local support is provided by forming an array of small spaced spots of coating on the screen.

5. A method according to claim 4, wherein said forming step comprises forming said small spaced spots of coating as a uniform array of spots.

6. A method according to claim 5, wherein said providing step comprises applying an emulsion to said screen to form said coating, exposing part of said coating to light using a patterned art work having a halftone region where said array of spots is to be formed.

7. A method according to claim 4 including the step of providing the regions of the coating surrounding and defining said at least one area in which an ink layer of increased thickness is required with a thickness greater than the thickness of the coating in other regions thereof.

8. A method according to claim 7, wherein said last-named providing step comprises providing the coating in said regions surrounding and defining said at least one area in which an ink layer of increased thickness is required with a thickness of at least 30 microns.

9. A method according to claim 7, wherein said last-named providing step comprises providing the coating in said other regions with a thickness in the range of 5 to 15 microns.

10. A method according to claim 4, wherein said forming step comprises forming said small spaced spots of coating of the same coating material as the patterned coating on the screen, and of a height equal to the thickness of said coating in the regions surrounding and defining said at least one area in which an ink layer of increased thickness is required.

11. A method according to claim 4, wherein said forming step comprises arranging said small spaced spots of coating to occupy about 10% of said at least one area in which the ink layer of increased thickness is required.

12. A method according to claim 1, wherein said printing step comprises printing said patterned ink layer in the form of a heating array on a glass pane for use as a vehicle window.

13. A method according to claim 12, wherein said printing step comprises printing said patterned ink layer as an array of heating conductors extending between bus bars, and said providing step comprises providing the local support in those areas of the bus bars where connectors for conductors supplying heating current are to be attached.

14. An improved printing screen with a patterned coating on at least one surface thereof the improvement comprising an array of small spaced spots of coating on the screen surface in each of one or more areas in which a patterned ink layer of increased thickness is required and a thicker coating in the areas surrounding and defining the area(s) in which an ink layer of increased thickness is required than in other areas.

15. A printing screen according to claim 14 wherein the thickness of the coating in the areas surrounding and defining the area(s) in which an ink layer of increased thickness is required is at least 30 microns.

16. A printing screen according to claim 15 wherein the coating in other areas has a thickness in the range 5 to 15 microns.

17. A printing screen according to claim 14 wherein the coating in other areas has a thickness in the range 5 to 15 microns.

18. An improved printing screen with a patterned coating on at least one surface thereof for forming a patterned ink layer, a patch of screen material adhered to the screen within said coating pattern so as to occupy at least one discrete area of said pattern at which the thickness of the ink layer is to be increased, said patch occupying less than the entire area of said coating pattern so that an area of said coating pattern which is free of said patch produces an ink layer of less thickness than said increased thickness.

* * * * *